United States Patent
Ju (10) Patent No.: US 10,547,152 B2
(45) Date of Patent: Jan. 28, 2020

(54) ELECTRICAL CONNECTOR ASSEMBLY METHOD

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 43 days.

(21) Appl. No.: 15/869,709

(22) Filed: Jan. 12, 2018

(65) Prior Publication Data

US 2019/0006807 A1    Jan. 3, 2019

(30) Foreign Application Priority Data

Jun. 29, 2017   (CN) .......................... 2017 1 0517005

(51) Int. Cl.
| | |
|---|---|
| *H01R 12/00* | (2006.01) |
| *H01R 43/02* | (2006.01) |
| *H01R 12/57* | (2011.01) |
| *H01R 4/02* | (2006.01) |
| *H01R 12/70* | (2011.01) |
| *H01R 12/58* | (2011.01) |
| *B23K 1/002* | (2006.01) |
| *B23K 1/00* | (2006.01) |

(Continued)

(52) U.S. Cl.
CPC ......... *H01R 43/0263* (2013.01); *B23K 1/002* (2013.01); *B23K 1/0016* (2013.01); *B23K 1/20* (2013.01); *H01R 4/02* (2013.01); *H01R 4/024* (2013.01); *H01R 12/57* (2013.01); *H01R 12/585* (2013.01); *H01R 12/707* (2013.01); *H01R 43/205* (2013.01); *H05K 3/3426* (2013.01); *H01R 12/7082* (2013.01); *H05K 1/111* (2013.01); *H05K 3/34* (2013.01); *H05K 2201/09472* (2013.01); *H05K 2201/10295* (2013.01)

(58) Field of Classification Search
CPC ...... H01R 43/0263; H01R 4/02; H01R 12/57; H01R 12/585; H01R 12/707; H05K 3/34; H05K 2201/10295
USPC ....................................................... 439/77–83
See application file for complete search history.

(56) References Cited

U.S. PATENT DOCUMENTS

| | | | |
|---|---|---|---|
| 2014/0008101 A1* | 1/2014 | Brandts | H01R 43/02 174/126.1 |
| 2015/0162677 A1* | 6/2015 | Schmalbuch | H01R 12/57 439/81 |
| 2018/0287269 A1* | 10/2018 | Ju | H01R 13/2442 |

FOREIGN PATENT DOCUMENTS

| | | |
|---|---|---|
| CN | 2351844 Y | 12/1999 |
| CN | 1571627 A | 1/2005 |

(Continued)

*Primary Examiner* — Khiem M Nguyen
(74) *Attorney, Agent, or Firm* — Locke Lord LLP; Tim Tingkang Xia, Esq.

(57) ABSTRACT

An electrical connector assembly method, including the steps of: step 1: providing a terminal having a soldering portion; step 2: heating the soldering portion to a melting temperature of a solder; step 3: providing the solder, and press-fitting the solder to the soldering portion by a jig, so that the solder is fused and fixed to the soldering portion; and step 4: inserting the terminal fixed with the solder into an insulating body. Because only the soldering portion of the terminal is heated, less thermal energy is needed, thereby saving energy and reducing the production cost of the electrical connector. Moreover, the insulating body does not need to be heated, thus preventing the insulating body from being warped and deformed due to heat.

8 Claims, 7 Drawing Sheets

(51) Int. Cl.
*H01R 43/20* (2006.01)
*B23K 1/20* (2006.01)
*H05K 3/34* (2006.01)
*H05K 1/11* (2006.01)

(56) References Cited

FOREIGN PATENT DOCUMENTS

| | | |
|---|---|---|
| CN | 104701654 A | 6/2015 |
| CN | 206532914 U | 9/2017 |

\* cited by examiner

ELECTRICAL CONNECTOR ASSEMBLY METHOD

CROSS-REFERENCE TO RELATED PATENT APPLICATION

This application claims priority to and the benefit of, pursuant to 35 U.S.C. § 119(a), patent application Serial No. CN201710517005.5 filed in China on Jun. 29, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to an electrical connector assembly method, and particularly to an electrical connector assembly method that can reduce thermal energy needed for soldering a solder and a terminal.

BACKGROUND

Conventionally, an electrical connector is located between a chip module and a circuit board for electrically connecting the chip module and the circuit board, and generally includes an insulating body, and conducting terminals accommodated in the insulating body. Each conducting terminal urges upward against the chip module, and urges downward against the circuit board, so as to implement signal transmission between the chip module and the circuit board.

Currently, a solder is usually disposed between a soldering portion of the conducting terminal and the circuit board, so that the solder implements the electrical connection between the soldering portion and a gasket of the circuit board. The soldering portion and the solder are generally fixed by means of heating, and the solder is pre-soldered and fixed on the soldering portion. The so-called pre-soldering is generally performed as follows: each conducting terminal is assembled into an insulating body, and the solder is in contact with the soldering portion by a tool for positioning the solder. Then the insulating body, the conducting terminals, the solder and the positioning tool are altogether placed in a heating apparatus for pre-soldering. In such pre-soldering manner, all components of the electrical connector are placed in the heating and pre-soldering apparatus for heating. There are many components to be heated, and therefore much thermal energy is needed, causing a waste of energy. Moreover, because the insulating body is heated, it is easy for the insulating body to be warped and deformed by the heat.

Therefore, a heretofore unaddressed need to design an electrical connector assembly method exists in the art to address the aforementioned deficiencies and inadequacies.

SUMMARY

In view of the problems in the related art, an objective of the present invention is directed to an electrical connector assembly method that reduces the production cost.

To achieve the foregoing objective, one aspect of the invention provides an electrical connector assembly method, which includes the following steps: step 1: providing a terminal having a soldering portion; step 2: heating the soldering portion to a melting temperature of a solder; step 3: providing the solder, and press-fitting the solder to the soldering portion by a jig, so that the solder is fused and fixed to the soldering portion; and step 4: inserting the terminal fixed with the solder into an insulating body.

In certain embodiments, in step 2, the soldering portion is heated by high-frequency current induction, and the solder is press-fit to the soldering portion within 15 seconds after the soldering portion is stopped from being heating.

In certain embodiments, the soldering portion is in a vertical flat plate shape, the solder is located at a side of a plate surface of the soldering portion, and a bottom surface of the solder is lower than a bottom surface of the soldering portion.

In certain embodiments, the solder is a cuboid shape, and the solder and the soldering portion are laminated face to face.

In certain embodiments, in a horizontal direction, a width of the soldering portion is less than a width of the solder.

In certain embodiments, in a horizontal direction, a width of the soldering portion is greater than a width of the solder.

In certain embodiments, a base portion is formed by extending upward vertically from the soldering portion, a first arm is formed by bending away from a vertical plane of the base portion and extending upward from the base portion, a second arm is formed by bending reversely and extending upward from the first arm and crossing the vertical plane of the base portion, and the first arm and the solder are located at a same side of the vertical plane of the base portion.

In certain embodiments, the insulating body has a plurality of accommodating holes vertically running through the insulating body; each of the accommodating holes has a retaining slot for retaining the base portion, and is provided with an accommodating slot at one side of the soldering portion for accommodating the solder; the accommodating slot and the retaining slot communicate with each other; a width of the retaining slot is greater than a width of the accommodating slot; and each of the accommodating holes is provided with a reserved slot at an opposite side of the soldering portion, wherein when press-fitting the solder from the one side of the soldering portion, the reserved slot provides a deformation space to the soldering portion.

In certain embodiments, a width of the base portion is greater than a width of the soldering portion, and the base portion is provided with a barrier layer preventing from siphoning and being located higher than the solder.

In certain embodiments, when the solder is soldered to a circuit board, a height of the solder is reduced by more than 0.3 millimeters compared with that before the solder is soldered to the circuit board.

Compared with the related art, the electrical connector assembly method according to certain embodiments of the invention has the following beneficial effects.

A soldering portion of a terminal is heated to a melting temperature of a solder, and then the solder is press-fit to the soldering portion by a jig, so that the solder is fused and fixed to the soldering portion. Because only the soldering portion of the terminal is heated, less thermal energy is needed, thereby saving energy and reducing the production cost of the electrical connector. Moreover, the insulating body does not need to be heated, thus preventing the insulating body from being warped and deformed due to heat.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
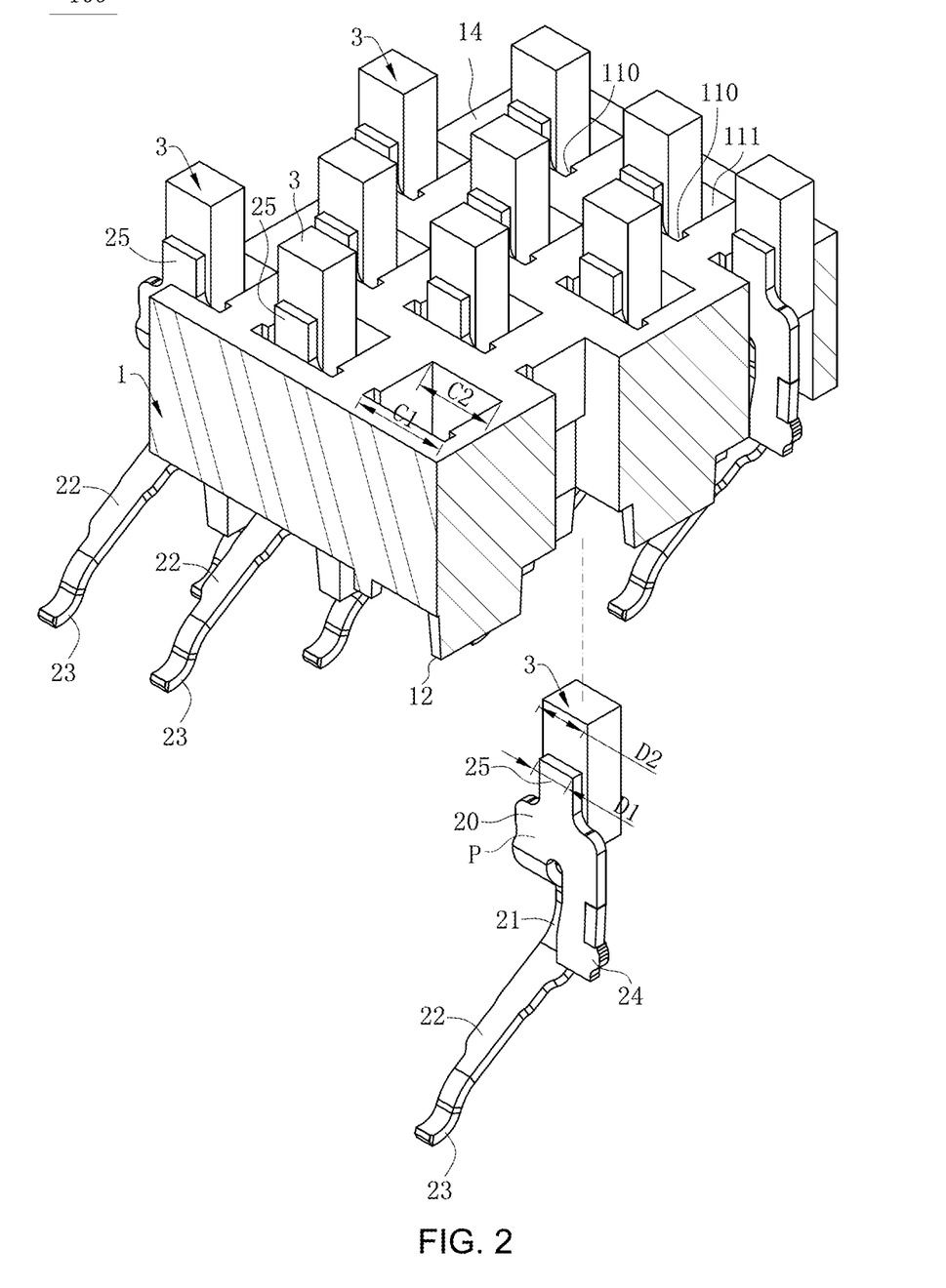
FIG. 2 is a perspective sectional view of the electrical connector in another viewing angle according to the first embodiment of the present invention.
Figure 6:
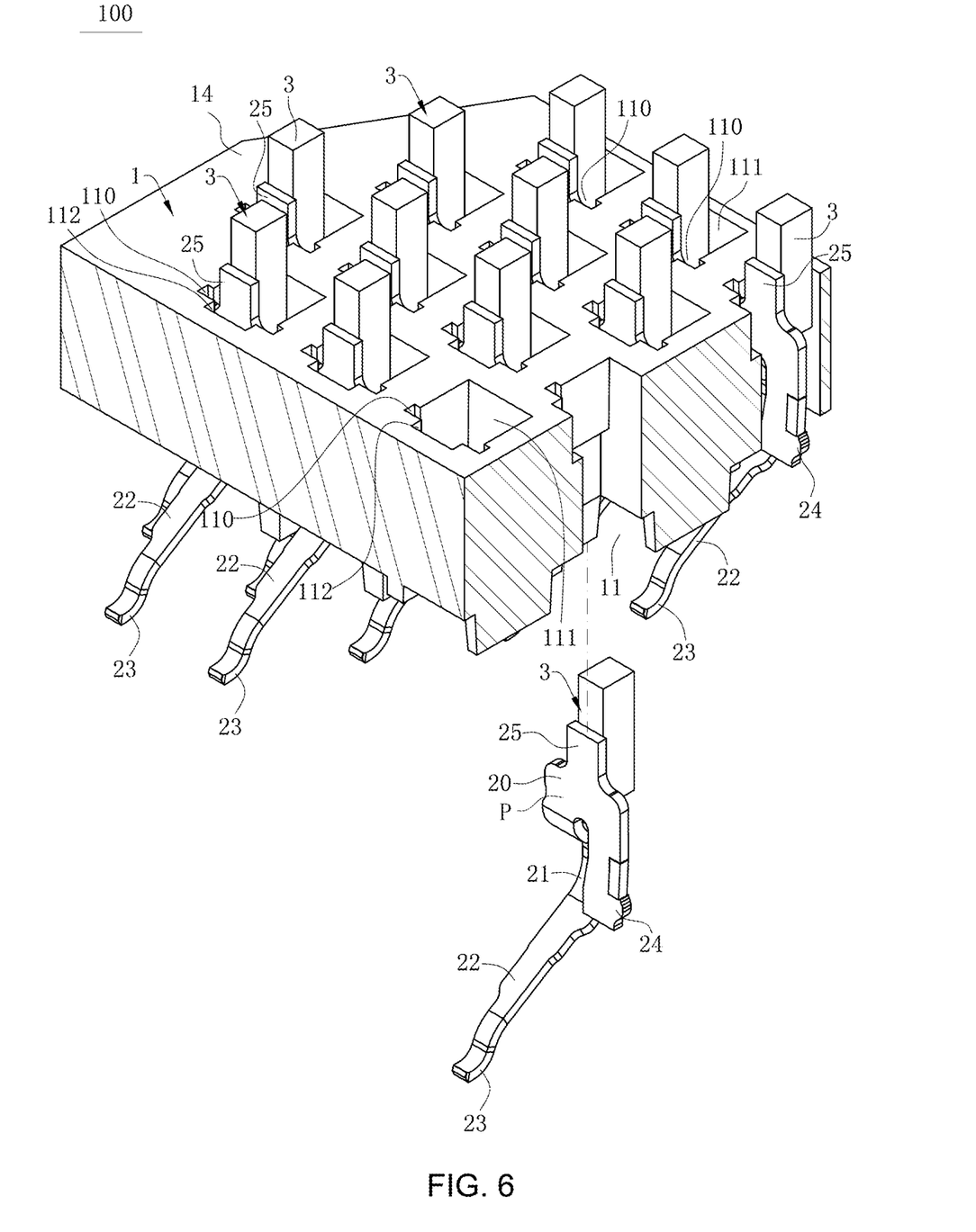
FIG. 6 is a perspective sectional view of an electrical connector according to a second embodiment of the present invention.
Figure 7:
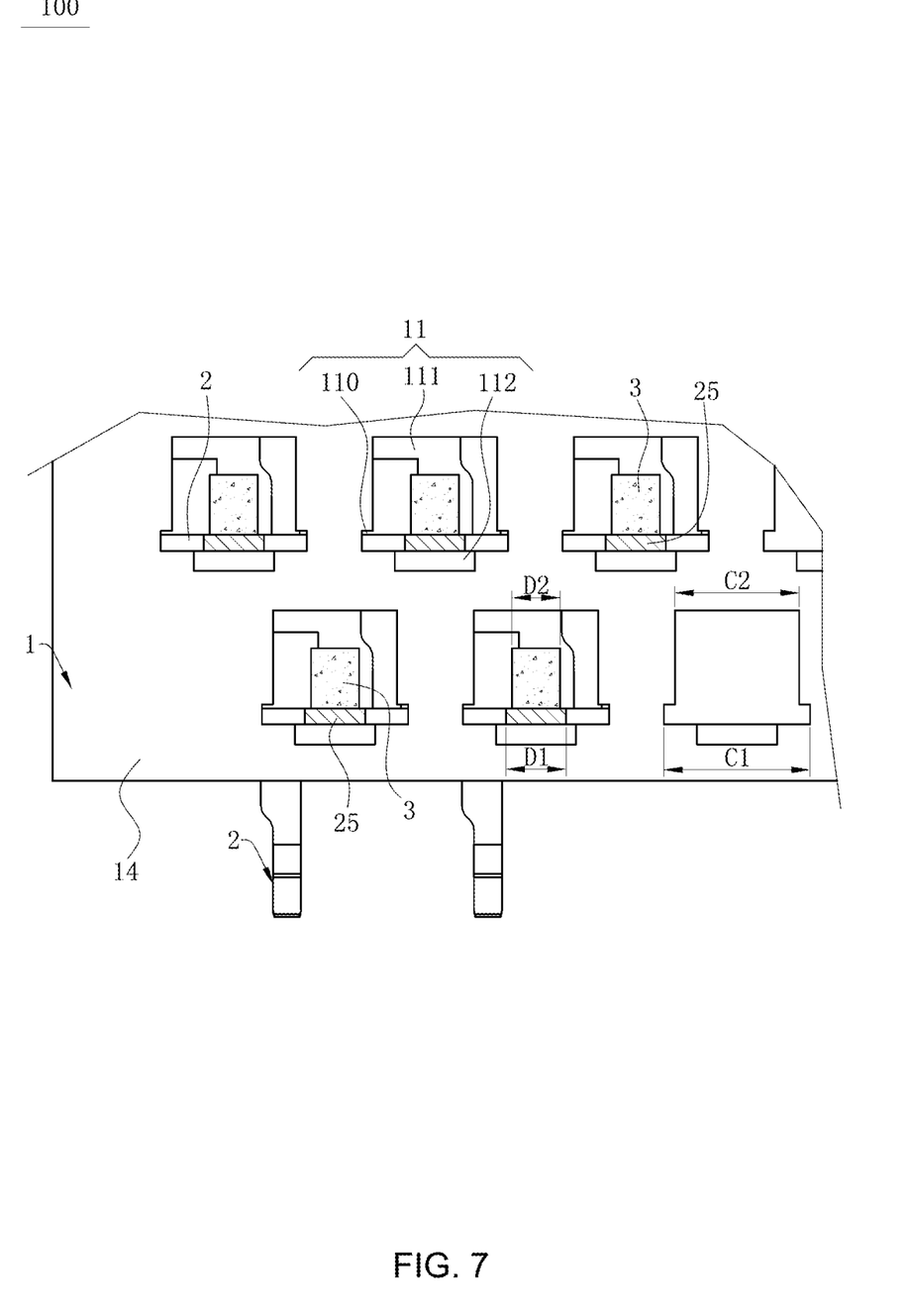
FIG. 7 is a plain view of the electrical connector according to the second embodiment of the present invention.

It should be noted that some of the drawings are schematic views from different angles. For example, FIG. 2 is a perspective sectional view of the electrical connector in another viewing angle according to the first embodiment of the present invention, in which the electrical connector is turned over in an upside-down position. Similarly, FIG. 6 is a perspective sectional view of an electrical connector according to a second embodiment of the present invention, and FIG. 7 is a plain view of the electrical connector according to the second embodiment of the present invention, in which the electrical connector is turned over in an upside-down position. In other words, for all the components as shown in each of FIGS. 2, 6 and 7, a "lower" direction refers to the direction toward the top of the drawing, and an "upper" direction refers to the direction toward the bottom of the drawing.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector assembly method.

FIG. 1 to FIG. 5 show an electrical connector 100 according to a first embodiment of the present invention, including an insulating body 1, terminals 2 accommodated in the insulating body 1, and a solder 3 fixed to one of the terminals 2.

Figure 1:
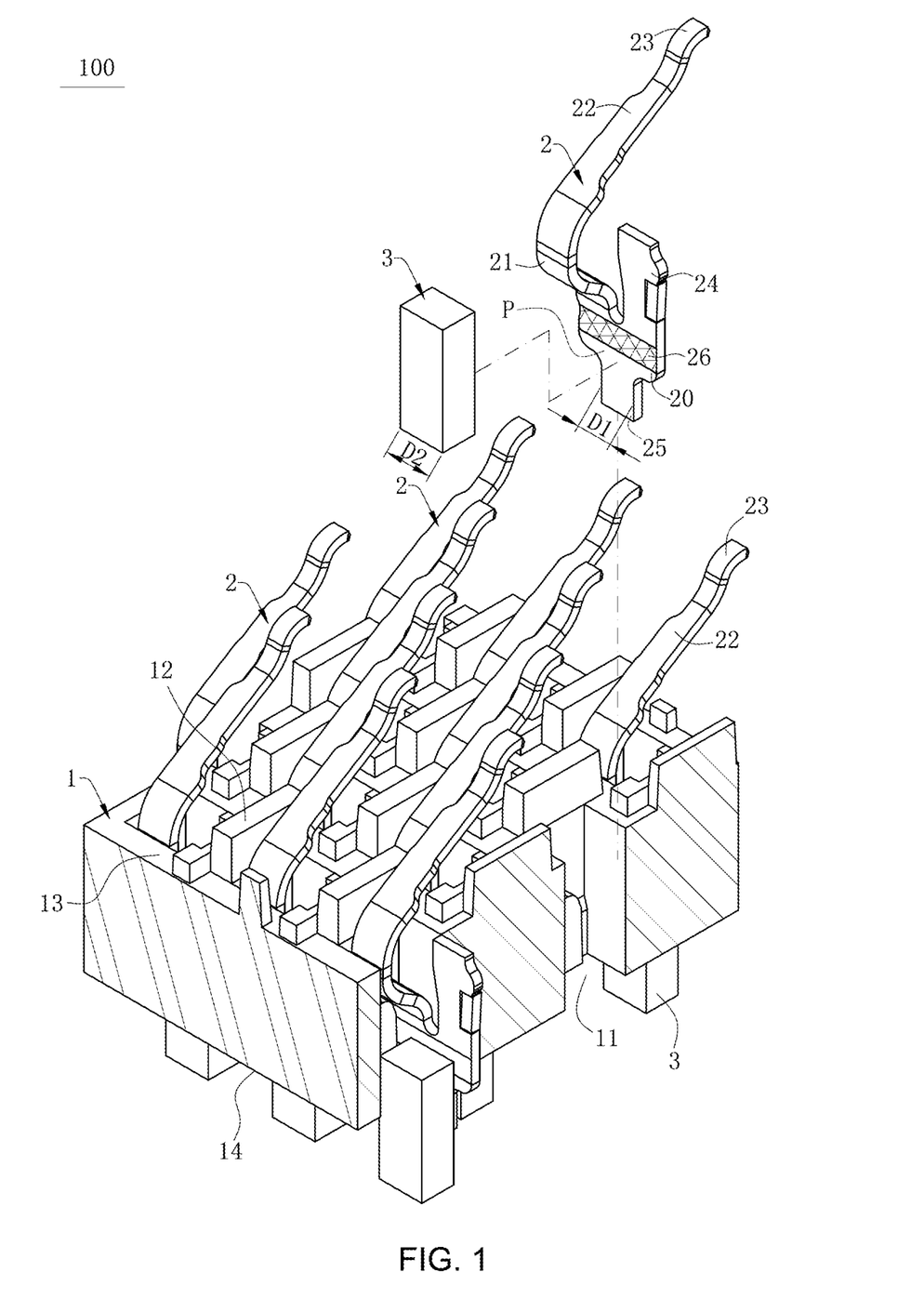
FIG. 1 is a perspective sectional view of an electrical connector according to a first embodiment of the present invention.
Figure 3:
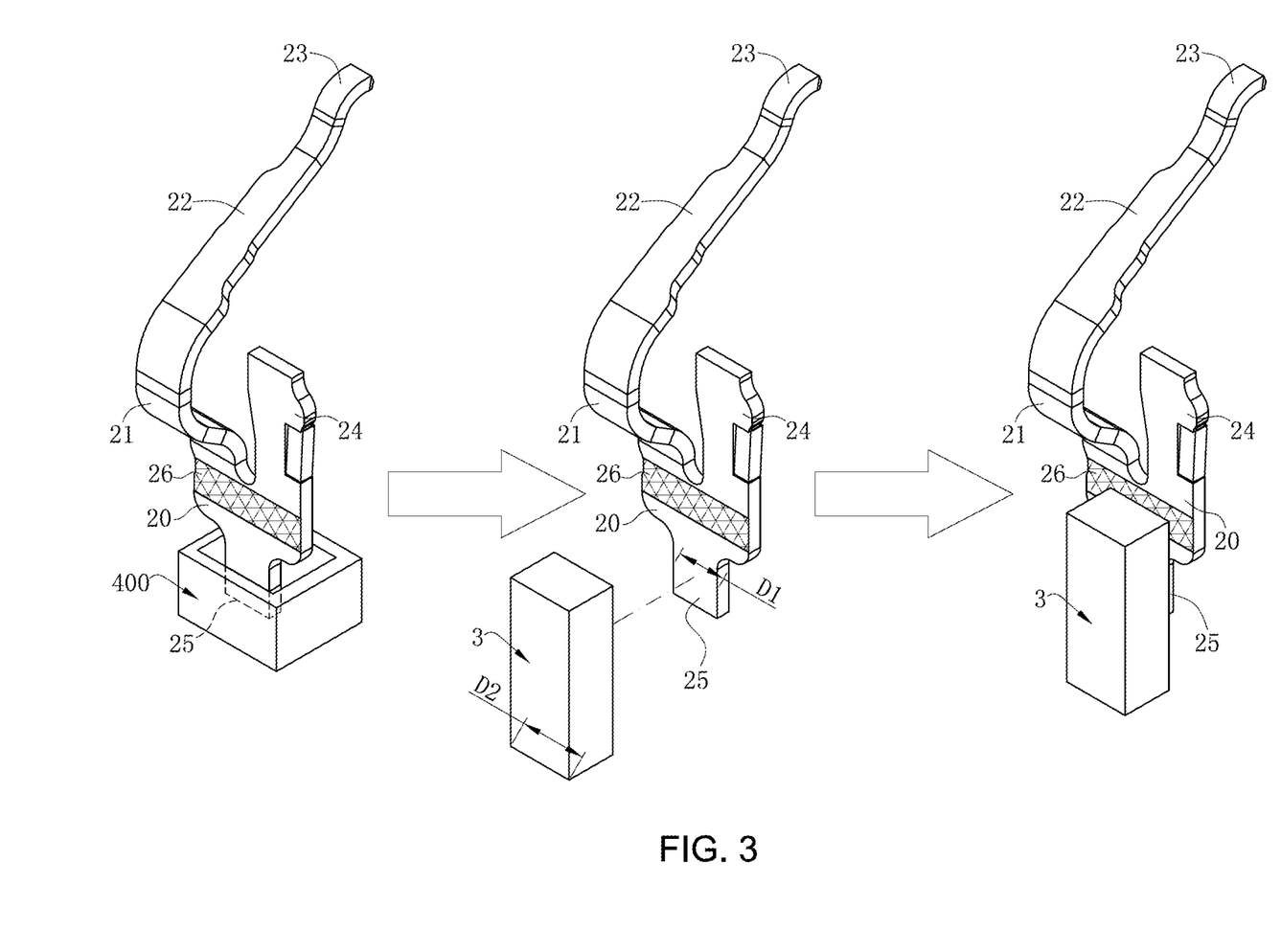
FIG. 3 is a schematic view of press-fitting between a solder and a soldering portion of the electrical connector according to the first embodiment of the present invention.
Figure 4:
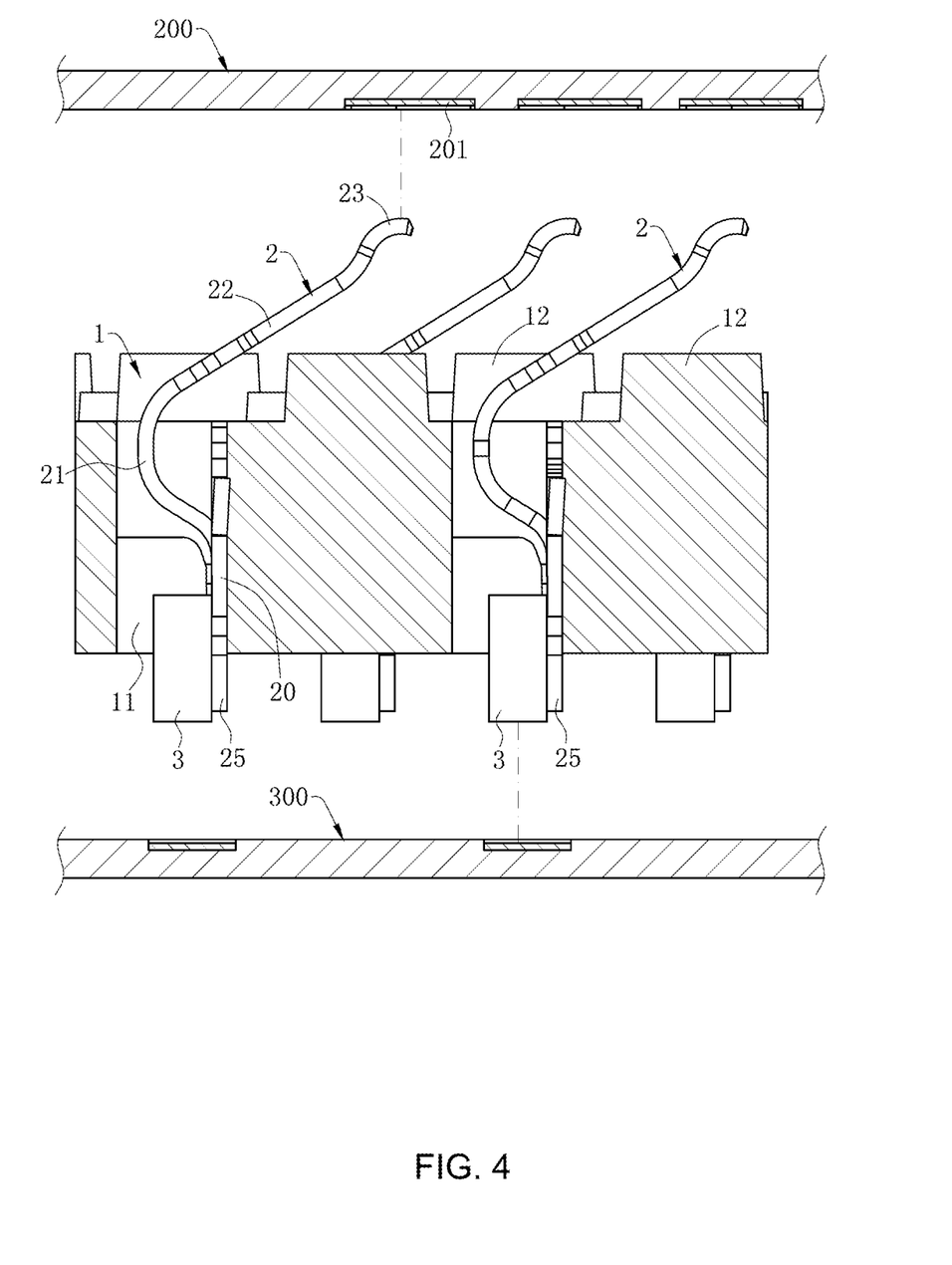
FIG. 4 is a plain sectional view of the electrical connector being located between a chip module and a circuit board and the chip module being not pressed downward according to the first embodiment of the present invention.
Figure 5:
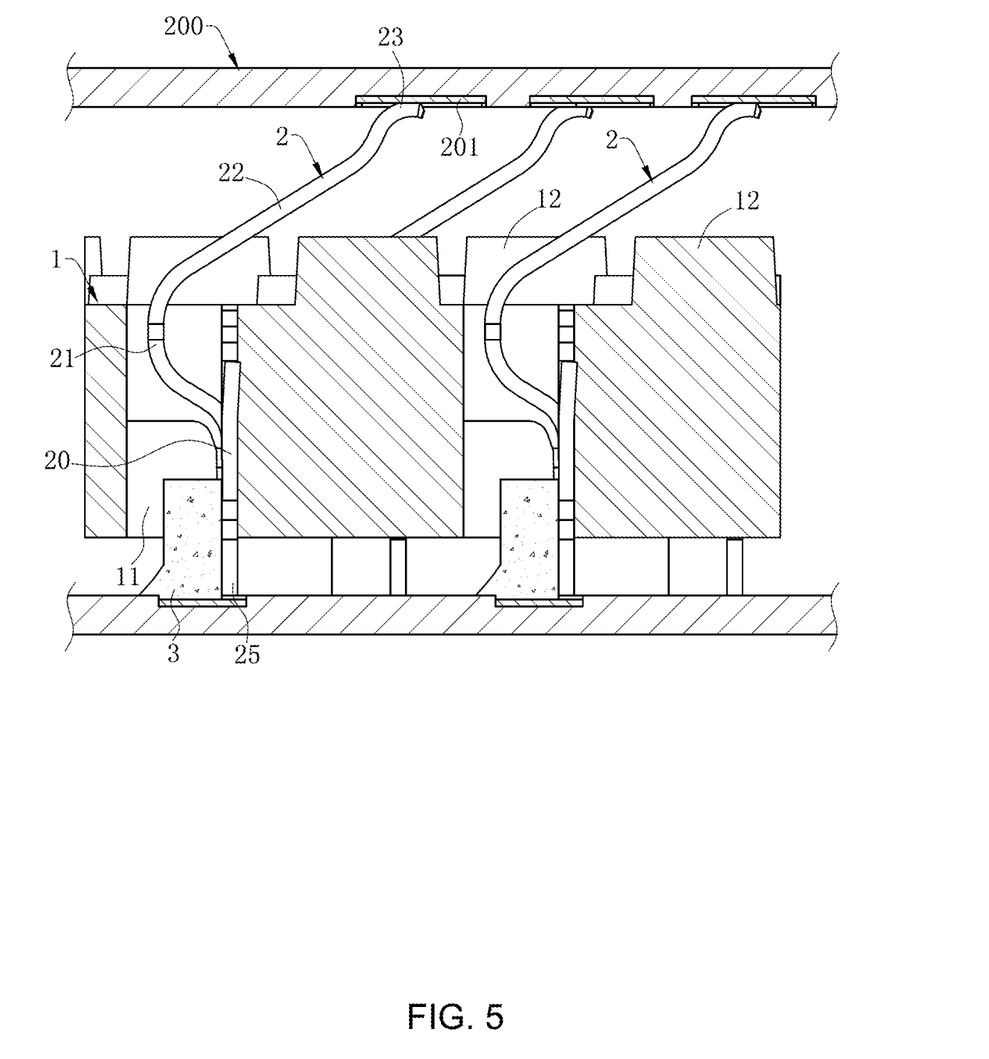
FIG. 5 is a plain sectional view of the electrical connector being located between a chip module and a circuit board and the chip module being pressed downward according to the first embodiment of the present invention.

As shown in FIG. 1 and FIG. 3, the insulating body 1 includes an upper surface 13 and a lower surface 14 disposed opposite to each other. Multiple protruding blocks 12 are protrudingly provided upward on the upper surface 13 for upward supporting a chip module 200. The insulating body 1 is provided with multiple accommodating holes 11 disposed in rows and in a staggered manner, which run through the upper surface 13 and the lower surface 14 of the insulating body 1. Each accommodating hole 11 includes a retaining slot 110 and an accommodating slot 111 located at a side of the retaining slot 110. The accommodating slot 111 and the retaining slot 110 are in communication with each other, and a width C1 of the retaining slot is greater than a width C2 of the accommodating slot.

As shown in FIG. 1 to FIG. 3, each terminal 2 is accommodated in the corresponding accommodating hole 11. Each terminal 2 includes a base portion 20 in a flat plate shape, and the base portion 20 is retained in the retaining slot 110. A first arm 21 is formed by bending away from a vertical plane P of the base portion 20 and extending upward from the base portion 20. A second arm 22 is formed by bending reversely and extending upward from the first arm 21 and crossing the vertical plane P of the base portion 20. An arc-shaped contact portion 23 is formed at an end of the second arm 22 for urging upward against a conducting sheet 201 of the chip module 200. A strip connecting portion 24 is formed by extending upward from the base portion 20 for connecting to a strip (not shown, similarly hereinafter), and a clearance is between the strip connecting portion 24 and the first arm 21. A soldering portion 25 is formed by extends vertically downward from the base portion 20, and the soldering portion 25 extends out of the lower surface 14 of the insulating body 1. The base portion 20 and the soldering portion 25 are located on the same vertical plane, so that the terminal 2 is simple in structure, and easy to form. In a horizontal direction, a width D1 of the soldering portion is less than a width of the base portion 20.

As shown in FIG. 1 to FIG. 3, a barrier layer 26 is provided on the base portion 20 for preventing siphoning. The barrier layer 26 is located higher than the solder 3, and the barrier layer 26 may be a coating or may be in other forms.

As shown in FIG. 1 to FIG. 3, the solder 3 is a cuboid shape. The solder 3 is located at a side of the soldering portion 25, and the solder 3 and the first arm 21 are located at a same side of the vertical plane P, so as to reduce a length of the accommodating hole 11 in a thickness direction of the terminal 2, and help facilitate intensification of the terminals 2 on the insulating body 1. The solder 3 is accommodated in the accommodating slot 111. In a horizontal direction, a width D2 of the solder is greater than a width D1 of the soldering portion, and the lower surface of the solder 3 is lower than the lower surface of the soldering portion 25. In another embodiment, the solder 3 may be in another shape such as a sphere, and the solder 3 may be located at a different location from a side of a plate surface of the soldering portion 25. For example, the solder 3 may be located on a bottom surface of the soldering portion 25.

As shown in FIG. 1 to FIG. 3, an assembly method for the electrical connector 100 is as follows. First, the terminals 2 are formed by a stamping die (not shown). Then, the soldering portions 25 of the terminals 2 continuously connected to the strip are placed in a heating apparatus 400, and the soldering portions 25 are heated to a melting temperature of the solder 3. In this embodiment, the heating apparatus 400 heats the soldering portions 25 by means of high-frequency current induction (that is, high-frequency waves) because heating by high-frequency waves is more uniform compared with heating by a laser. Consequently, within 15 seconds (otherwise, the temperature of the soldering portion 25 drops below the melting temperature of the solder 3), the solder 3 is press-fit from a side of the plate surface of the soldering portion 25 by a jig (not shown, similarly hereinafter), so that a side surface of the solder 3 and the plate surface of the soldering portion 25 are laminated and fixed. Finally, each terminal 2 fixed with the solder 3 is inserted downward from the top into a corresponding accommodating hole 11 of the insulating body 1 and fixed therein. When the assembly of the electrical connector 100 is completed, the solder 3 is soldered to a circuit board 300, so that the electrical connector 100 is soldered onto the circuit board 300. Comparing the solder 3 before and after being soldered to the circuit board 300, a height of the solder 3 is reduced by more than 0.3 millimeters by being soldered to the circuit board 300.

FIG. 6 and FIG. 7 show an electrical connector according to a second embodiment of the present invention. The differences between the second embodiment and the first embodiment exist in that the width D1 of the soldering portion is greater than the width D2 of the solder, and the other opposite side of the retaining slot 110 is provided with a reserved slot 112. The reserved slot 112 and the retaining slot 110 are in communication with each other. The reserved slot 112 and the accommodating slot 111 are located at two opposite sides of the soldering portion 25, and the reserved slot 112 provides an elastic deformation space for the soldering portion 25 when the solder 3 and the soldering portion 25 are press-fit.

To sum up, the electrical connector assembly method according to certain embodiments of the present invention has the following beneficial effects.

(1) A soldering portion 25 of a terminal 2 is heated to a melting temperature of a solder 3, and then the solder 3 is press-fit to the soldering portion 25 by a jig, so that the solder 3 is fused and fixed to the soldering portion 25. Because only the soldering portion 25 of the terminal 2 is heated, less thermal energy is needed, thereby saving energy and reducing the production cost of the electrical connector 100. Moreover, the insulating body 1 does not need to be heated, thus preventing the insulating body 1 from being warped and deformed due to heat.

(2) The solder 3 and the first arm 21 are located at a same side of the vertical plane P, so as to reduce the length of the accommodating hole 11 in the thickness direction of the soldering portion 25, and help facilitate intensification of the terminals 2 on the insulating body 1.

(3) The solder 3 is a cuboid shape, which has a regular shape, so that the jig used for press-fitting the solder 3 is simple in its structure, and forming and assembly may be easy.

(4) In the horizontal direction, the width D2 of the solder is greater than the width D1 of the soldering portion, so that when the solder 3 is melted, the solder 3 may bypass the soldering portion 25 and be in contact with a plate surface at the other side of the soldering portion 25, so as to wrap around the soldering portion 25, thereby improving the electrical connection effect between the terminals 2 and the circuit board 300.

The above detailed description only describes preferable embodiments of the present invention, and is not intended to limit the patent scope of the present invention, so any equivalent technical changes made by use of the specification of the creation and the content shown in the drawings fall within the patent scope of the present invention.

While there has been shown several and alternate embodiments of the present invention, it is to be understood that certain changes can be made as would be known to one skilled in the art without departing from the underlying scope of the present invention as is discussed and set forth above and below including claims. Furthermore, the embodiments described above and claims set forth below are only intended to illustrate the principles of the present invention and are not intended to limit the scope of the present invention to the disclosed elements.

What is claimed is:

1. An electrical connector assembly method, comprising the steps of:
   step 1: providing a terminal having a soldering portion, wherein the soldering portion is in a vertical flat plate shape;
   step 2: heating the soldering portion to a melting temperature of a solder, wherein the solder is located at a side of a plate surface of the soldering portion, and a bottom surface of the solder is lower than a bottom surface of the soldering portion;
   step 3: providing the solder, and press-fitting the solder to the soldering portion by a jig, so that the solder is fused and fixed to the soldering portion; and
   step 4: inserting the terminal fixed with the solder into an insulating body;
   wherein a base portion is formed by extending upward vertically from the soldering portion, a first arm is formed by bending away from a vertical plane of the base portion and extending upward from the base portion, a second arm is formed by bending reversely and extending upward from the first arm and crossing the vertical plane of the base portion, and the first arm and the solder are located at a same side of the vertical plane of the base portion.

2. The electrical connector assembly method according to claim 1, wherein in step 2, the soldering portion is heated by high-frequency current induction, and the solder is press-fit to the soldering portion within 15 seconds after the soldering portion is stopped from being heating.

3. The electrical connector assembly method according to claim 1, wherein the solder is a cuboid shape, and the solder and the soldering portion are laminated face to face.

4. The electrical connector assembly method according to claim 3, wherein in a horizontal direction, a width of the soldering portion is less than a width of the solder.

5. The electrical connector assembly method according to claim 3, wherein in a horizontal direction, a width of the soldering portion is greater than a width of the solder.

6. The electrical connector assembly method according to claim 1, wherein:
   the insulating body has a plurality of accommodating holes vertically running through the insulating body;
   each of the accommodating holes has a retaining slot for retaining the base portion, and is provided with an accommodating slot at one side of the soldering portion for accommodating the solder;
   the accommodating slot and the retaining slot communicate with each other;
   a width of the retaining slot is greater than a width of the accommodating slot; and
   each of the accommodating holes is provided with a reserved slot at an opposite side of the soldering portion, wherein when press-fitting the solder from the one side of the soldering portion, the reserved slot provides a deformation space to the soldering portion.

7. The electrical connector assembly method according to claim 1, wherein a width of the base portion is greater than a width of the soldering portion, and the base portion is provided with a barrier layer preventing from siphoning and being located higher than the solder.

8. The electrical connector assembly method according to claim 1, wherein when the solder is soldered to a circuit board, a height of the solder is reduced by more than 0.3 millimeters compared with that before the solder is soldered to the circuit board.

* * * * *